(12) United States Patent
Nishikawa et al.

(10) Patent No.: US 7,654,708 B2
(45) Date of Patent: *Feb. 2, 2010

(54) LIGHT SOURCE DEVICE AND PROJECTION-TYPE IMAGE DISPLAY DEVICE

(75) Inventors: Kimito Nishikawa, Tokyo (JP); Yoshinori Kakuta, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 102 days.

This patent is subject to a terminal disclaimer.

(21) Appl. No.: 11/292,062

(22) Filed: Dec. 2, 2005

(65) Prior Publication Data

US 2006/0209544 A1    Sep. 21, 2006

(30) Foreign Application Priority Data

Mar. 16, 2005    (JP)    ............................. 2005-074330

(51) Int. Cl.
*B60Q 1/06* (2006.01)
*F21V 29/00* (2006.01)

(52) U.S. Cl. ........................ 362/373; 362/261; 362/264; 362/294; 362/345

(58) Field of Classification Search ......... 362/261–264, 362/294, 345, 538, 547, 373
See application file for complete search history.

(56) References Cited

U.S. PATENT DOCUMENTS

| 5,860,719 A * | 1/1999 | Suzuki et al. .................. 353/61 |
| 6,509,674 B1 | 1/2003 | Nakagawa |
| 6,759,794 B2 * | 7/2004 | Wilson et al. ................ 313/113 |

FOREIGN PATENT DOCUMENTS

| CN | 1525239 A | 9/2004 |
| JP | 8-7841 A | 1/1996 |
| JP | 10-223023 A | 8/1998 |
| JP | 10-254061 A | 9/1998 |
| JP | 2000-036215 A | 2/2000 |
| JP | 2002-107823 A | 4/2002 |

* cited by examiner

*Primary Examiner*—Jason Moon Han
(74) *Attorney, Agent, or Firm*—Birch, Stewart, Kolasch & Birch, LLP (57) ABSTRACT

A light source device (10) includes a lamp unit (1) and a lamp cartridge (2) in which the lamp unit (1) is housed. The lamp unit (1) includes a discharge lamp (11), a reflection mirror (12) and a transparent plate (13). The reflection mirror (12) has ventilation openings (121). The lamp cartridge (2) has ventilation openings (214, 215 and 231). Fragment-passage prevention members (30, 31 and 32) are provided on the ventilation openings (214, 215 and 231). The fragment-passage prevention members (30) allow the passage of the air but prevent the passage of the fragments of the discharge lamp (11). With such an arrangement, it is possible to prevent the fragments from being scattered out of the lamp cartridge (2), even when the breakage of the discharge lamp (11) occurs.

11 Claims, 11 Drawing Sheets

LIGHT SOURCE DEVICE AND PROJECTION-TYPE IMAGE DISPLAY DEVICE

BACKGROUND OF THE INVENTION

This invention relates to a light source device having a lamp, and relates to a projection-type image display device using the light source device.

A light source device used in a projection-type image display device includes a lamp unit and a lamp cartridge in which the lamp unit is housed. The lamp unit includes a lamp (such as a metal halide lamp or a xenon lamp) and a reflection mirror. Conventionally, there is a case where an arc tube of the lamp is broken (due to the increase of internal pressure) while the lamp is turned on, and therefore it is necessary to prevent components in the projection-type image display device from being damaged by fragments (i.e., broken pieces) of the lamp. For this purpose, there is provided a lamp unit having an encapsulated structure in which a transparent plate (such as a glass plate) closes an opening of the light emitting side of the reflection mirror, as disclosed in, for example, Japanese Laid-Open Publication No. HEI 8-7841 (Page 2, FIG. 1).

However, in such a lamp unit having the encapsulated structure, the temperature of the interior of the reflection mirror (i.e., a space surrounded by the reflection mirror and the transparent plate) tends to increase due to an arc between electrodes while the lamp is turned on. Further, in these days, the luminance of the projection-type image display device increases, and therefore the output of the lamp also increases, with the result that the temperature of the interior of the reflection mirror tends to increase. As a result, there are problems that the lifetime of the lamp may be shortened, the luminance may be reduced, and the breakage of the lamp may easily occur.

In order to solve these problems, there is proposed a light source device having a ventilation opening formed on the reflection mirror for circulating the air. In such a light source device, it is necessary to prevent the fragments of the lamp from being scattered out of the light source device (i.e., in the projection-type image display device) via the ventilation opening. Therefore, a mesh member (made of metal) is provided to cover the ventilation opening, as disclosed in, for example, Japanese Patent Publication No. 3275755 (Pages 1-2, FIG. 1) and Japanese Laid-Open Patent Publication No. HEI 10-254061 (Pages 4-5, FIG. 1). Additionally, there is proposed another light source device configured to open the ventilation opening when the light source device is mounted in the projection-type image display device, and to close the ventilation opening when the light source device is detached from the projection-type image display device, as disclosed in Japanese Laid-Open Patent Publication No. 2002-107823 (Page 2, FIG. 8).

However, if the mesh member closes the ventilation opening (as disclosed in Japanese Patent Publication Nos. 3275755 and Japanese Laid-Open Patent Publication No. HEI 10-254061), the mesh member needs to be formed in accordance with the shape of the ventilation opening. Further, if a plurality of ventilation openings are formed on the reflection mirror, it is necessary to provide a plurality of mesh members for covering the respective ventilation openings.

Moreover, the reflection mirror and the transparent plate are generally made of hard-cutting material (i.e., quarts glass), and therefore the shape of the ventilation opening is limited, and the tolerance is relatively large, in terms of manufacturing method and manufacturing cost. In order to prevent the small fragments of the lamp from being scattered via a clearance between the ventilation opening and the mesh member, it is necessary to take measures to fill in the clearance, and therefore the manufacturing cost may increase. Further, if the mesh member is not properly fixed to the ventilation opening of the reflection mirror, the lamp unit itself becomes a defective unit, and therefore yield ratio is lowered.

Furthermore, a ventilation opening is also formed on the lamp cartridge in accordance with the position and the shape of the ventilation opening of the reflection mirror. Therefore, a common lamp cartridge can not be used for different lamp units whose reflection mirrors have different ventilation openings in shape or position.

Additionally, in the light source device configured to open and close the ventilation opening of the reflection mirror (as disclosed in Japanese Laid-Open Patent Publication No. 2002-107823), the ventilation opening is not closed when the breakage of the lamp occurs, and therefore it is not possible to prevent the fragments of the lamp from being scattered out of the light source device (i.e., in the projection type image display device). Further, there is a possibility that the fragments of the lamp may be carried by the cooling air to the exterior of the image display device.

SUMMARY OF THE INVENTION

An object of the present invention is to prevent fragments of a lamp from being scattered even when a breakage of the lamp occurs.

The present invention provides a light source device including a lamp unit. The lamp unit includes a lamp, a reflection mirror that reflects a light from the lamp and emits the light. The reflection mirror has at least one ventilation opening. The light source device further includes a lamp cartridge that houses the lamp unit and has at least one ventilation opening. One of the lamp cartridge and the lamp unit has a transparent plate disposed on a light emitting side of the reflection mirror. A fragment-passage prevention member is provided on ventilation opening of the lamp cartridge. The fragment-passage prevention member allows the passage of the air but prevents the passage of fragments of the lamp.

With such an arrangement, due to the fragment-passage prevention member provided on the ventilation opening of the lamp cartridge, it is possible to prevent the fragments of the lamp from being scattered out of the lamp cartridge (i.e., out of the light source device), even if the breakage of the lamp occurs. Moreover, since the fragment-passage prevention member is provided on the lamp cartridge, it is not necessary to provide a fragment-passage prevention member on the ventilation opening of the reflection mirror. Therefore, the manufacturing cost can be reduced, even when the reflection mirror is made of hard cutting material.

Furthermore, there is less restriction on the structure of the reflection mirror, compared with a configuration in which the fragment-passage prevention member is provided on the ventilation opening of the reflection mirror. Therefore, it is possible to configure the reflection mirror so that the lamp unit gives the best performance. In addition, since it is not necessary to align the ventilation opening of the reflection mirror with the ventilation opening of the lamp cartridge, a common lamp cartridge can be used even when the shape of the ventilation opening becomes diversified. Thus, the productivity can be enhanced, and the manufacturing cost can be reduced.

DETAILED DESCRIPTION OF THE PREFERRED EMBODIMENT

Embodiments of the present invention will be described with reference to the attached drawings.

Embodiment 1.

Figure 1:
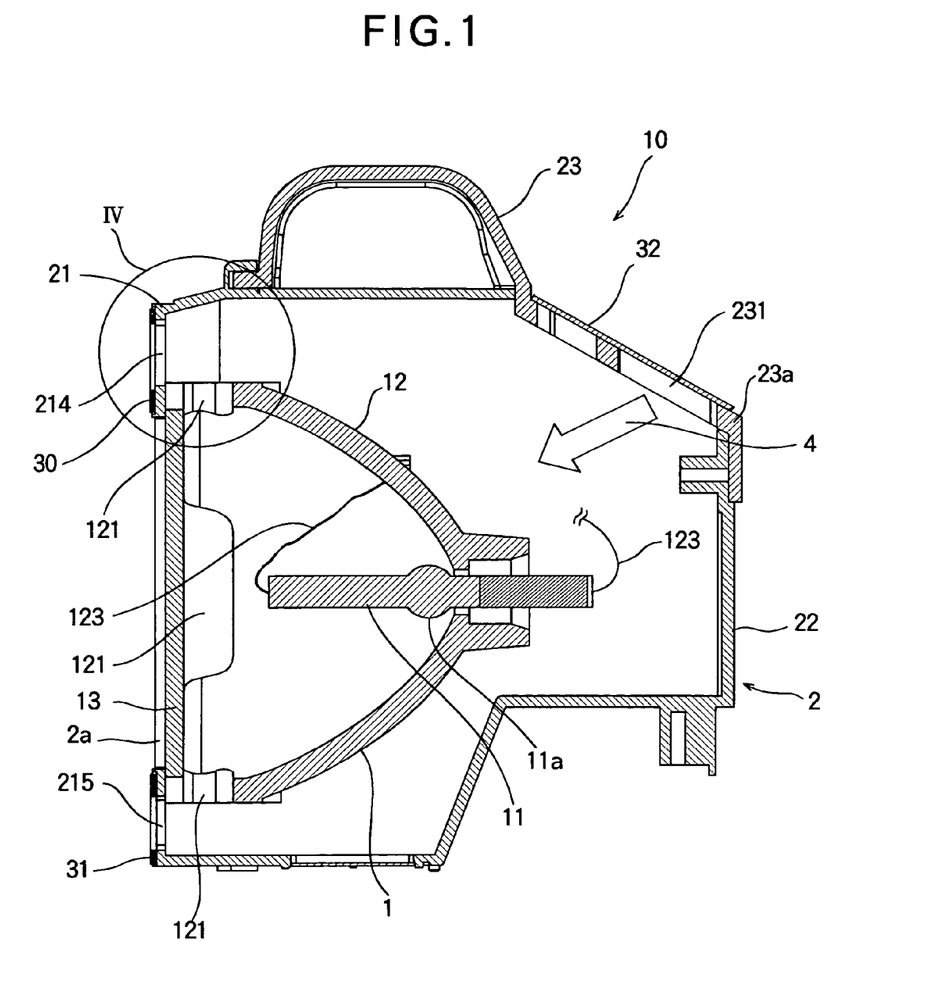
FIG. 1 is a sectional view of a light source device according to Embodiment 1 of the present invention.
Figure 2:
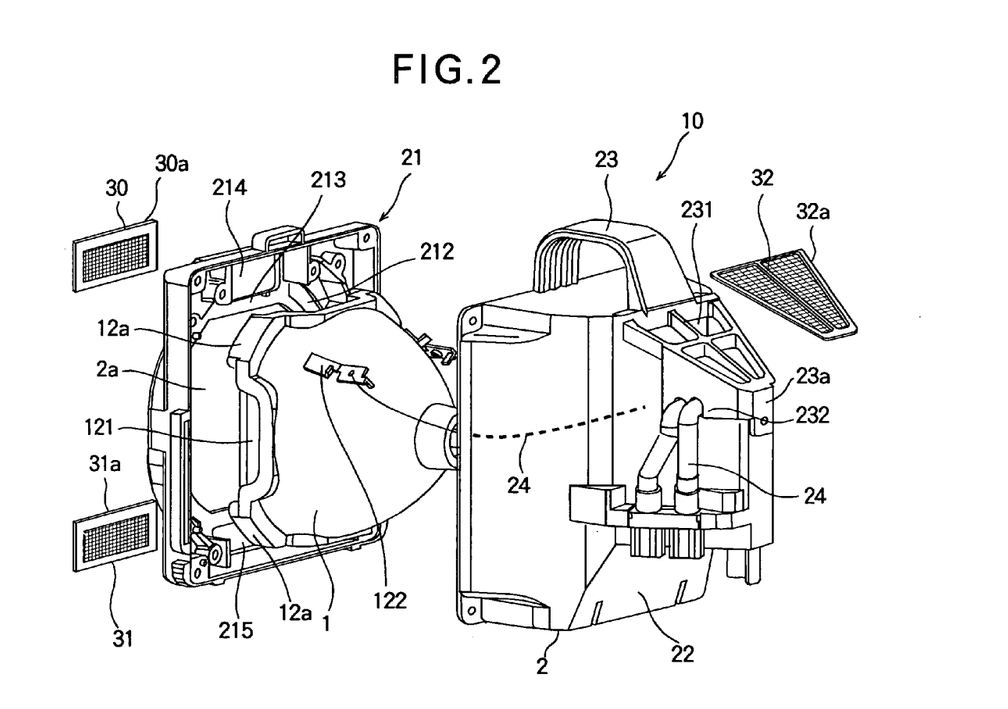
FIG. 2 is an exploded perspective view of the light source device according to Embodiment 1 of the present invention.
Figure 3:
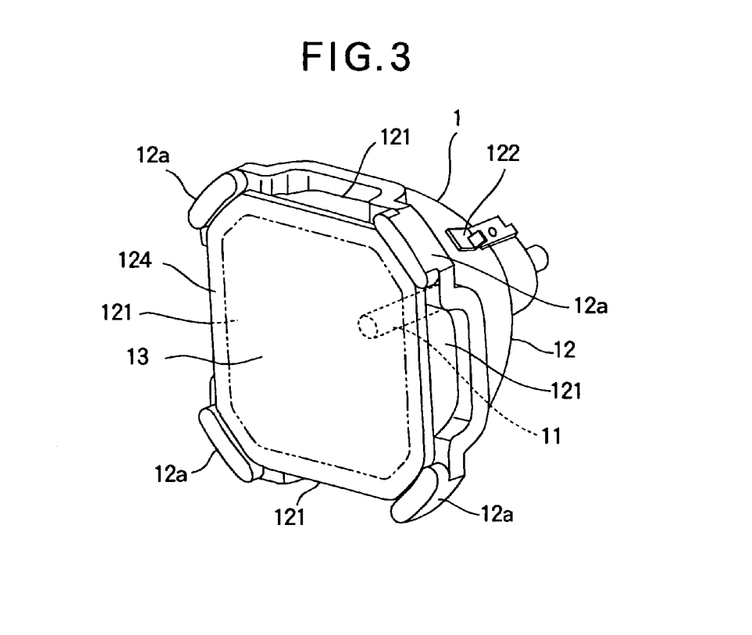
FIG. 3 is a perspective view of a lamp unit of the light source device according to Embodiment 1 of the present invention.
Figure 4:
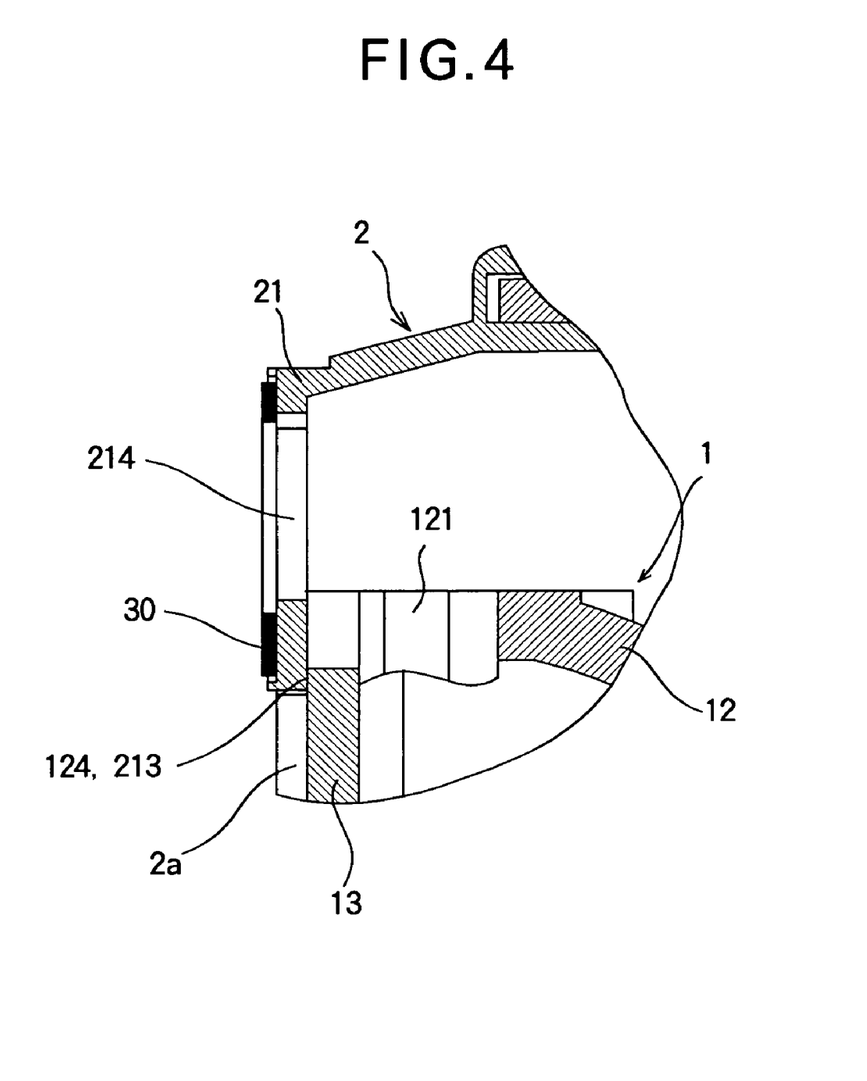
FIG. 4 is an enlarged sectional view of a part of the light source device according to Embodiment 1 of the present invention.

FIG. 1 is a vertical sectional view of a light source device 10 according to Embodiment 1 of the present invention. FIG. 2 is an exploded perspective view of the light source device 10 as seen from the rear. FIG. 3 is a perspective view showing a lamp unit 1 of the light source device 10 shown in FIG. 1. FIG. 4 is an enlarged perspective view of a part of the light source device 10 indicated by sign "IV" in FIG. 1.

As shown in FIGS. 1 and 2, the light source device 10 includes a lamp unit 1 and a lamp cartridge 2 in which the lamp unit 1 is housed. As shown in FIG. 1, the lamp unit 1 includes a discharge lamp 11 elongated in one direction (left-right direction in FIG. 1). The discharge lamp 11 is composed of, for example, a metal halide lamp, a xenon lamp or the like.

The lamp unit 1 includes a reflection mirror 12 that reflects a divergent light emitted by the discharge lamp 11 and emits the light in the left in FIG. 1. The reflection mirror 12 is in the form of a body of rotation whose center is aligned with a center axis of the discharge lamp 11. The light emitting side (i.e., the left side in FIG. 1) of the reflection mirror 12 is opened. An end of the reflection lamp 11 is fixed to the right end (an end opposite to the light emitting side) of the reflection mirror 12. Both ends of the discharge lamp 11 are connected to two electrode terminals 122 (via lead wires 123) shown in FIG. 2 fixed to the circumferential surface of the reflection mirror 12.

Hereinafter, the left side in FIG. 1 (i.e., the light emitting side of the discharge lamp 11 and the reflection mirror 12) is defined as "front", and the right side in FIG. 1 is defined as "rear". The upward and downward directions in FIG. 1 are respectively defined as "upward" and "downward". Moreover, "left" and "right" are defined along the direction perpendicular to a paper of FIG. 1.

The lamp unit 1 further includes a transparent plate 13 made of a material that transmits the light (for example, a transparent glass) provided on the opening of the reflection mirror 12. The transparent plate 13 is larger than an effective area irradiated with light emitted by the discharge lamp 11 and reflected by the reflection mirror 12 (generally, an area of the opening of the reflection mirror 12). A space surrounded by the reflection mirror 12 and the transparent plate 13 is a substantially closed space, in which an arc 11a of the discharge lamp 11 is disposed.

As shown in FIG. 3, four guide portions 12a are provided on the front end of the reflection mirror 12. The guide portions 12a protrude frontward from the front end of the reflection mirror 12 so as to position the circumference of the transparent plate 13. The guide portions 12a are disposed on four corners (for example, upper right, upper left, lower right and lower left) of the opening the reflection mirror 12. The transparent plate 13 fits in the inner sides of the guide portions 12a. It is also possible to fix the transparent plate 13 to the front end of the reflection mirror 12 without using the guide portions 12a.

A plurality of ventilation openings 121 (i.e., cutout portions) are formed on the front end of the reflection mirror 12. In the configuration example shown in FIG. 3, four ventilation openings 121 are disposed respectively on upper, lower, left and right sides with respect to the transparent plate 13. The ventilation openings 121 are provided for circulating the air through the lamp unit 1. The ventilation openings 12a are not closed even if the transparent plate 13 is fixed to the reflection mirror 12.

As shown in FIG. 2, the lamp cartridge 2 includes a front panel 21 provided on the front side (i.e., the light emitting side) of the lamp unit 1, and a rear portion 22 provided on the rear side of the front panel 21. The front end of the reflection mirror 12 of the lamp unit 1 is fixed to the front panel 21. The rear portion 22 is fixed to the front panel 21 to form a housing in which the lamp unit 1 is housed. A grip portion 23 is provided on the top of the rear portion 22. The grip portion 23 is held by a user when the user carries the light source device 10.

An opening 2a is formed on the front panel 21 of the lamp cartridge 2, which transmits the light having passed the transparent plate 13 of the lamp unit 1. As shown in FIG. 3, a front surface of an area of several mm from the peripheral end of the transparent plate 13 (referred to as a mating surface 124) contacts a mating surface 213 (FIG. 4) formed around the opening 2a of the lamp cartridge 2. Although the mating surface 124 of the transparent plate 13 slightly obscures the light from the lamp unit 1, the mating surface 124 positions on the outermost portion of the transparent plate 13, so that the mating surface 124 does not influence the luminance of the projection-type image display device.

Although the light having passed the mating surface 124 of the transparent plate 13 is incident on the mating surface 213 of the lamp cartridge 2, the temperature increase of the mating surface 213 is in a range in which PPF (poly-phenylene sulfide: a general molding compound) can be used. Thus, it is possible to use PPS as the molding compound of the lamp cartridge 2.

Concaves 212 (FIG. 2) are formed on the front panel 21 of the lamp cartridge 2, which engage the guide portions 12a of the reflection mirror 12.

The above described grip portion 23 extends in the form of an arc above the rear portion 22. The grip portion 23 is integrally formed with a base portion 23a. The base portion 23a constitutes a part of an upper portion on the rear side of the rear portion 22. A cable 24 is fixed to the above described electrode terminals 122 (FIG. 2) for supplying electric current required for the light emission of the discharge lamp 11. The cable 24 is taken out of the lamp cartridge 2 via an opening 232 between the base portion 23a of the grip portion 23 and the rear portion 22. The opening 232 between the grip portion 23 and the rear portion 22 of the lamp cartridge 2 is formed in accordance with the outer shape of the cable 24, and leaves no gap between the opening 232 and the cable 24. With this, it is possible to prevent fragments (i.e., broken pieces) of the discharge lamp 11 from being scattered out of the lamp cartridge 2 via the gap between the opening 232 and the cable 24, even when the breakage of the discharge lamp 11 occurs.

Ventilation openings 214 and 215 are formed on the front panel 21 of the lamp cartridge 2, which allow the air (blown by an air blow fan or the like described later) to pass. The ventilation openings 214 and 215 are formed on the upper side and the lower side of the opening 2a of the front panel 21, and act as outlet openings. A ventilation opening 231 is formed on the base portion 23a of the grip portion 23 of the lamp cartridge 2, and act as an inlet opening.

The ventilation openings 214, 215 and 231 are closed by fragment-passage prevention members 30, 31 and 32. Each of the fragment-passage prevention members 30, 31 and 32 allows the passage of the air but prevents the passage of the fragments of the discharge lamp 11. Each of the fragment-passage prevention members 30, 31 and 32 is made of, for example, a mesh member having a mesh size that does not allow the passage of the fragments of the discharge lamp 11. The fragment-passage prevention members 30, 31 and 32 are made of, for example, metal or PPS having the heat resistance of approximately 150° C.

The fragment-passage prevention members 30, 31 and 32 have frames 30a, 31a and 32a that respectively hold the peripheral ends of the mesh portions (made of metal or heat-resistant PPS). The frames 30a, 31a and 32a are respectively attached to the surrounding surfaces of the ventilation openings 214, 215 and 231 by means of, for example, double-sided adhesive tapes having the heat resistance of approximately 150° C. If the lamp cartridge 2 is made of molding compound, the frames 30a, 31a and 32a of the fragment-passage prevention members 30, 31 and 32 (made of metal) can be fixed to the surrounding surfaces of the ventilation openings 214, 215 and 231 by baking.

A not shown air blow fan is provided on the outside of the light source device 10 (i.e., the inside of the projection-type image display device). The air blow fan blows the air into the lamp cartridge 2 via the ventilation opening 231 in the direction shown by an arrow 4 in FIG. 1.

In the above described light source device 10, the air blown by the air blow fan is introduced into the interior of the lamp cartridge 2 via the ventilation opening 231 in the direction shown by the arrow 4. The air flows frontward along the rear end portion of the discharge lamp 11 and the back surface of the reflection mirror 12, and cools the rear end portion of the discharge lamp 11 and the back surface of the reflection mirror 12. Further, the air is introduced in the interior of the reflection mirror 12 (i.e., a space surrounded by the reflection mirror 12 and the transparent plate 13) through the ventilation openings 121 formed on the front end of the reflection mirror 12, and cools the reflection surface 12a of the reflection mirror 12 and the arc tube 11a of the discharge lamp 11. After the air absorbs the heat generated by the discharge lamp 11, the air is fed out of the reflection mirror 12 via the ventilation openings 121, and fed out of the lamp cartridge 2 via the ventilation openings 214 and 215. Thus, the heat generated by the discharge lamp 11 is discharged out of the lamp cartridge 2, so that the excessive heating of the lamp unit 1 can be prevented.

If the discharge lamp 11 is broken, and if the fragments of the discharge lamp 11 is scattered out of the lamp unit 1 (inside the lamp cartridge 2), it is possible to prevent the fragments from being scattered out of the lamp cartridge 2, because the fragment-passage prevention members 30, 31 and 32 are provided on the ventilation openings 214, 215 and 231 of the lamp cartridge 2.

As described above, according to the light source device 10 of Embodiment 1, the fragment-passage prevention members 30, 31 and 32 (that prevent the passage of the fragments of the discharge lamp 11) are provided on the ventilation openings 214, 215 and 231 of the lamp cartridge 2, and therefore the fragments can be prevented from being scattered out of the lamp cartridge 2 even when the breakage of the discharge lamp 11 occurs.

Moreover, since the fragment-passage prevention members 30, 31 and 32 are provided on the ventilation openings 214, 215 and 231 of the lamp cartridge 2, it is not necessary to provide fragment-passage prevention members on the ventilation openings 121 of the reflection mirror 11. Therefore, there is less restriction on the structure of the lamp unit 1. Thus, it is possible to configure the reflection mirror 11 so that the lamp unit 1 gives the best performance.

Furthermore, if the fragment-passage prevention members are provided on the ventilation openings 121 of the reflection mirror 11 (for example, quarts glass), it is necessary to take measures to fill in the gap between the ventilation openings 121 and the fragment-passage prevention members. However, in Embodiment 1, it is not necessary to take such measures, since the fragment-passage prevention members 30, 31 and 32 are provided on the lamp cartridge 2. As a result, the yield rate of the lamp unit 1 can be enhanced, and the manufacturing cost can be reduced.

In addition, since the fragment-passage prevention members 30, 31 and 32 are made of mesh members, the configurations of the fragment-passage prevention members can be simplified. Further, each of the fragment-passage prevention members 30, 31 and 32 can be easily fixed to the lamp cartridge 2 using the double-sided adhesive tape or baking, and can be formed in the form of a flat plate. Therefore, there is a lot of flexibility in the choice of material and the fixing method, with the result that the manufacturing cost can be reduced.

Additionally, since the lamp cartridge 2 has at least one ventilation openings 214 and 215 on the front side of the lamp unit 1 and at least one ventilation opening 231 at the rear side of the lamp unit 1, it is possible to cause the air to flow from the rear side of the lamp unit 1 to the front side of the lamp unit 1, so that the back surface of the reflection mirror 12 and the rear end portion of the discharge lamp 11 can be sufficiently cooled.

In the above description, the ventilation openings 121 are formed on the front end (i.e., the end of the light emitting side) of the reflection mirror 12 of the lamp unit 1. However, the ventilation openings 121 are not necessarily formed on the front end of the reflection mirror 12, but can be formed on, for example, a center portion of the reflection mirror 12.

In the above description, two ventilation openings 214 and 215 are formed on the lamp cartridge 2 as outlet openings. It is possible to omit one of the ventilation openings 214 and 215 as long as the discharge lamp 11 can be sufficiently cooled.

Figure 5:
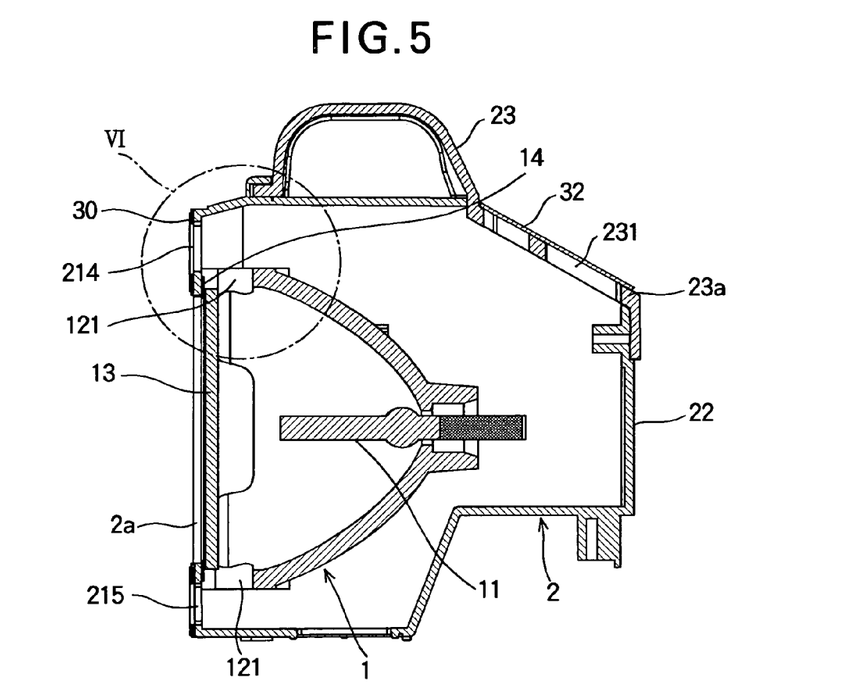
FIG. 5 is a vertical sectional view of a light source device according to a modification of Embodiment 1 of the present invention.
Figure 6:
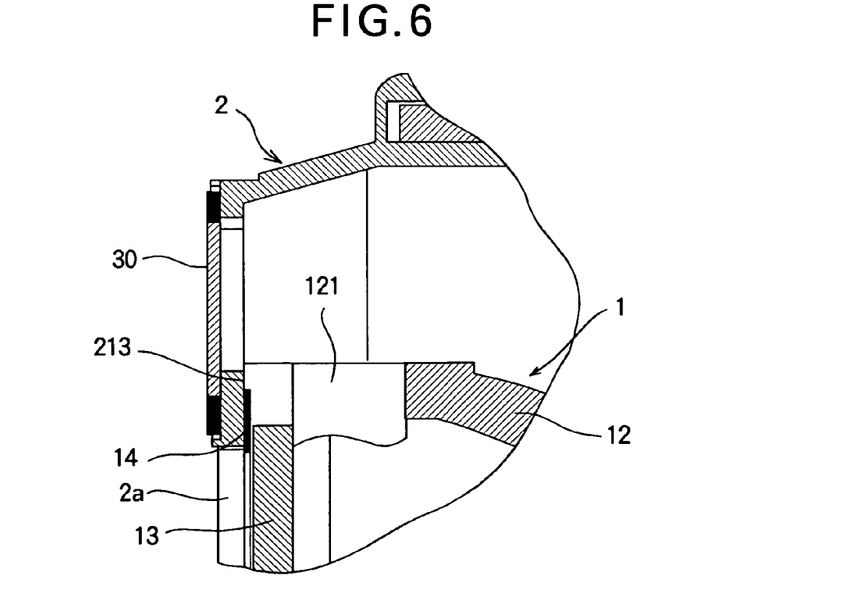
FIG. 6 is an enlarged sectional view of a part of the light source device according to the modification of Embodiment 1 of the present invention.
Figure 7:
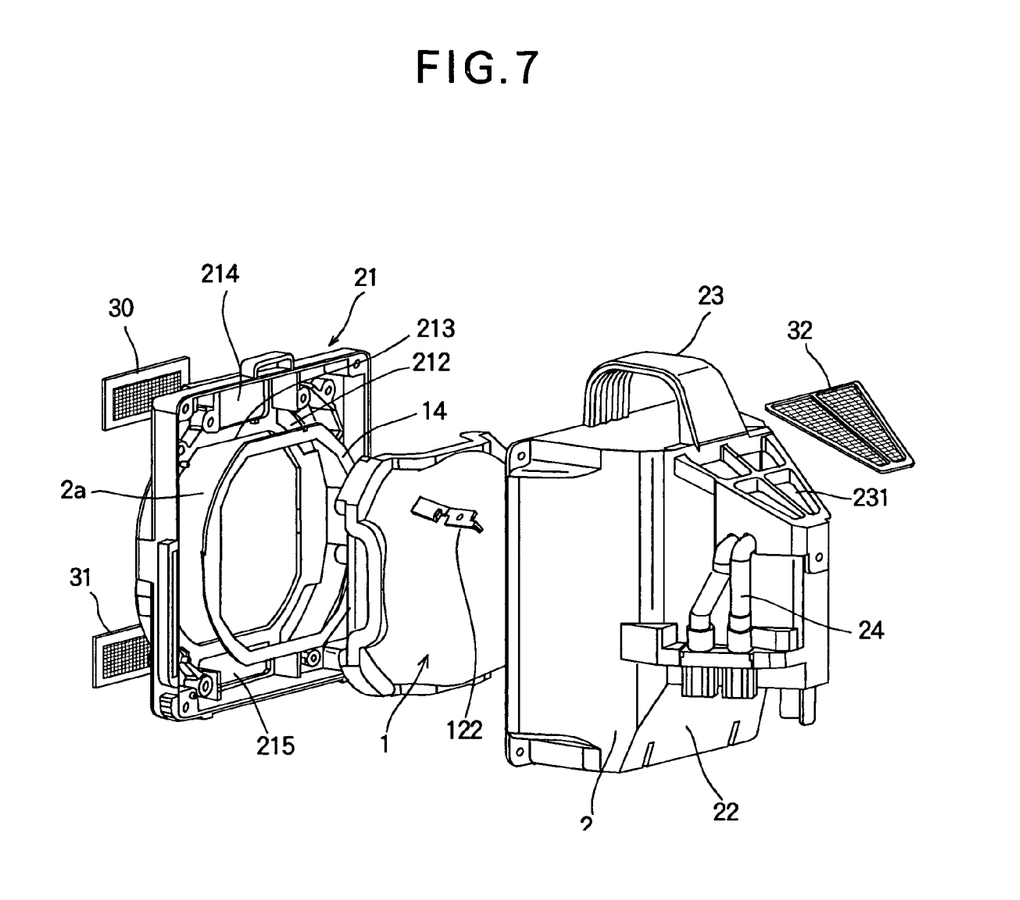
FIG. 7 is an exploded perspective view of the light source device according to the modification of Embodiment 1 of the present invention.

FIG. 5 is a sectional view of a light source device according to a modification of Embodiment 1 of the present invention. FIG. 6 is an enlarged sectional view of a part of the light source device shown in FIG. 5 indicated by sign "VI" in FIG. 5. FIG. 7 is a perspective view of the light source device shown in FIG. 5, as seen from the rear. In FIGS. 5 through 7, the components in common with those shown in FIGS. 1 through 4 are assigned the same reference numerals.

In the above described Embodiment 1, the mating surface 213 (FIG. 4) around the opening 2a of the lamp cartridge 2 is directly irradiated with the light from the discharge lamp 11 and the reflection mirror 12. Since the light includes ultraviolet rays, there are cases where it is necessary to take measures to prevent the generation of gas, according to the kind of material of the lamp cartridge 2.

In this modification, a spacer (i.e., a shielding member) 14 is provided between the mating surface 124 of the transparent plate 13 and the mating surface 213 of the lamp cartridge 2. The spacer 14 is made of, for example, a metal. The spacer 14 is in the form of, for example, a ring surrounding the opening 2a (FIG. 7) of the lamp cartridge 2. The spacer 14 prevents the light from directly being incident on the mating surface 213 of the lamp cartridge 2. With such an arrangement, it is possible to prevent the generation of the gas, irrespective of the kind of material of the lamp cartridge 2.

Embodiment 2

Figure 8:
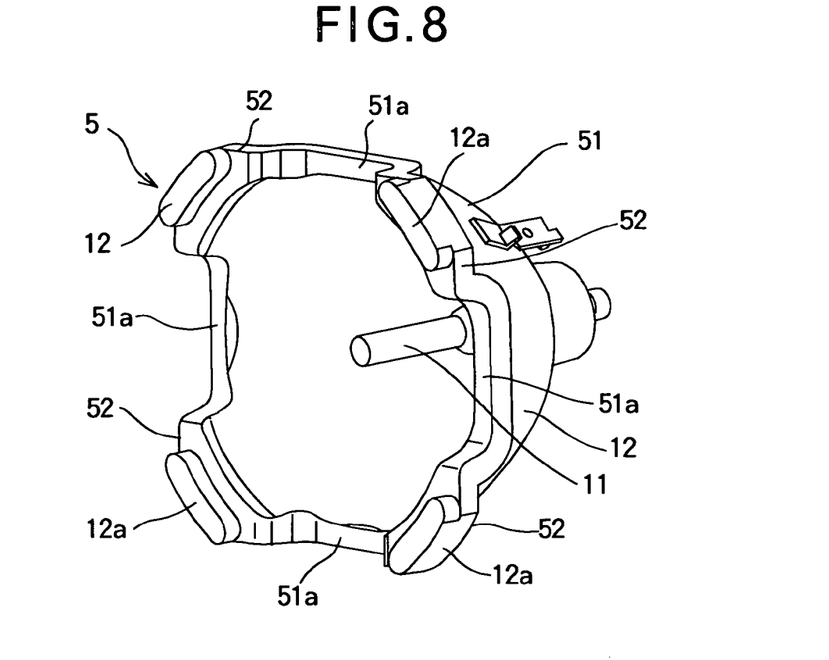
FIG. 8 is an exploded perspective view of a lamp unit according to Embodiment 2 of the present invention.
Figure 9:
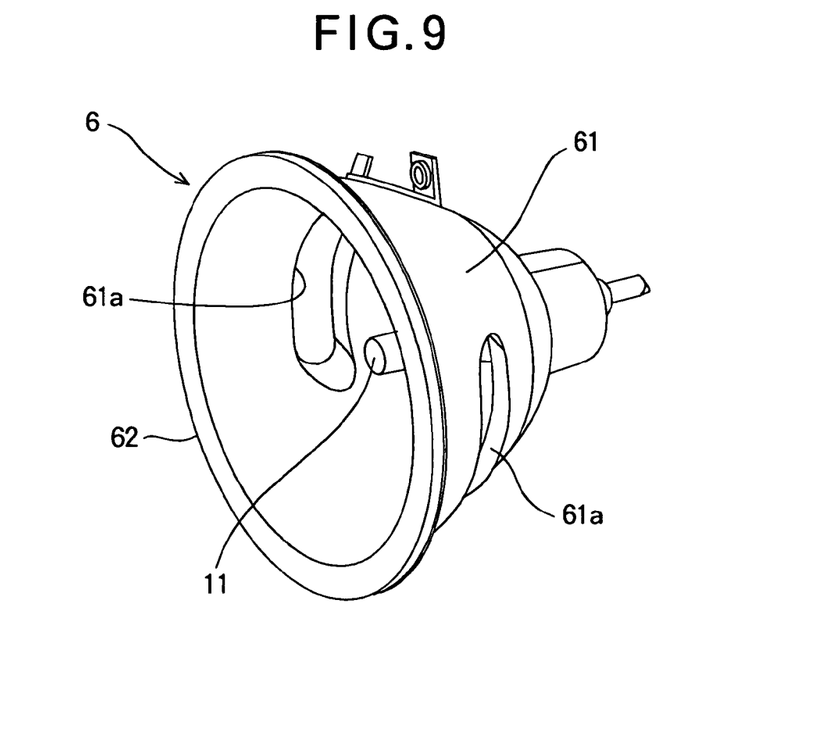
FIG. 9 is a perspective view of another example of the light source device according to Embodiment 2 of the present invention.

FIGS. 8 and 9 are perspective views respectively showing two types of lamp units 5 and 6 having no transparent plate. In Embodiment 2, two types of lamp units 5 and 6 whose reflection mirrors have different shapes are mountable on a common lamp cartridge. Moreover, each of the lamp units 5 and 6 has no transparent plate (i.e., the front side of the reflection mirror is opened).

The lamp unit 5 shown in FIG. 8 includes a discharge lamp 11 and a reflection mirror 51 that reflects the light emitted by the discharge lamp 11 and emits the light. The front end (i.e., the end of the light emitting side) of the reflection mirror 51 is opened. Ventilation openings 51a are formed on the front end of the reflection mirror 51. In a particular example, four ventilation openings 51a are disposed on upper, lower, left and right sides with respect to the opening of the reflection mirror 51.

Brims 52 protrude outward from the front end of the reflection mirror 51. In a particular example, four brims 52 are disposed on upper right, upper left, lower right and lower left portions of the front end of the reflection mirror 51. The guide members 12a (described in Embodiment 1) protrude frontward from the front end of the reflection mirror 51.

The lamp unit 6 shown in FIG. 9 includes a discharge lamp 11 and a reflection mirror 61 that reflects the light emitted by the discharge lamp 11 and emits the light. The front end (i.e., the end of the light emitting side) of the reflection mirror 61 is opened. Ventilation openings 61a are formed on the center portion of the reflection mirror 61. In a particular example, two ventilation openings 61a are disposed on two positions (on the reflection mirror 61) substantially symmetrical with respect to the discharge lamp 11. Each of the ventilation openings 61a extends in the circumferential direction of the reflection mirror 61 (i.e., along the circumference whose center is aligned with the discharge lamp 11).

A brim 62 protrudes outward from the front end of the reflection mirror 61. In a particular example, the brim 62 is ring-shaped, and extends along the front end of the reflection mirror 61.

Figure 10:
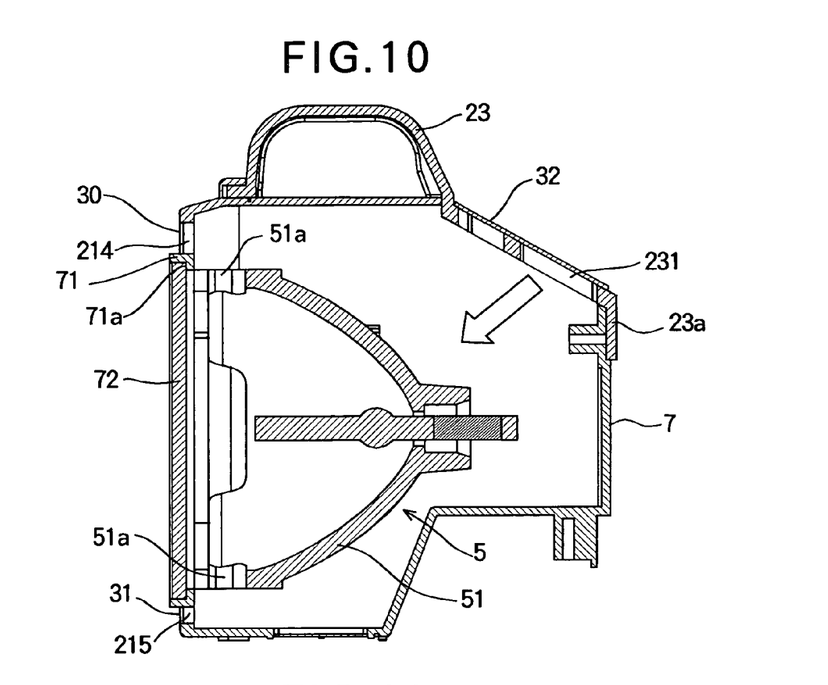
FIG. 10 is a vertical sectional view of a light source device in which the lamp unit shown in FIG. 8 is mounted on the lamp cartridge.
Figure 11:
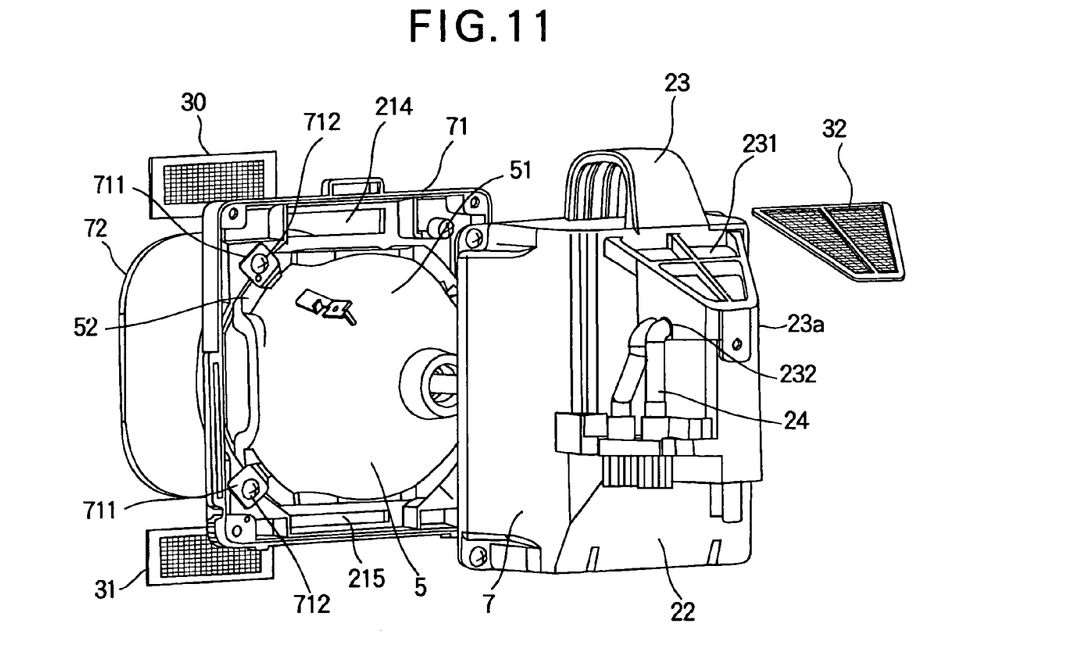
FIG. 11 is an exploded perspective view of the light source device shown in FIG. 10.

FIGS. 10 and 11 are a sectional view and an exploded perspective view (as seen from the rear) showing a lamp cartridge 7 on which the lamp unit 5 shown in FIG. 8 is mounted.

The configuration of the lamp cartridge 7 is the same as that of the lamp cartridge 2 described in Embodiment 1, except a mounting arrangement of the transparent plate 72 and the lamp units 5 and 6. The lamp cartridge 7 includes a front panel 71 disposed on the front side (the light emitting side) of the lamp unit 5 and the rear portion 22 disposed on the rear side of the front panel 71. A grip portion 23 is formed on the top of the rear portion 22. Ventilation openings 214 and 215 are formed on the front panel 71. A ventilation opening 231 is formed on a base portion 23a of the grip portion 23. Fragment-passage prevention members 30, 31 and 32 are provided on the ventilation openings 214, 215 and 231.

The front end of the lamp unit 5 is fixed to the front panel 71 of the lamp cartridge 7. As shown in FIG. 11, the brims 52 of the front end of the reflection mirror 51 of the lamp unit 5 are fixed to the front panel 71 of the lamp cartridge 7 by means of four fixing plates 711 and four screws 712. If there is a variation in the thickness of the brims 52 of the reflection mirror 51, it is also possible to use spring member as the fixing plates 711.

An opening is formed on the front panel 71 of the lamp cartridge 7 for transmitting the light from the lamp unit 5. A transparent plate 72 is provided on the opening of the front panel 71 from outside. The transparent plate 72 is fixed to the front panel 71 in such a manner that the transparent plate 72 contacts a mating surface 71a (FIG. 10) surrounding the opening of the front panel 71. It is possible to hold the periphery of the transparent plate 72 using plate-shaped fixing members. Alternatively, it is possible to adhere the transparent plate 72 to the mating surface 71a. The outer dimension of the transparent plate 72 is larger than the outer dimension of the front end of the reflection mirror 51 by several mm.

Figure 12:
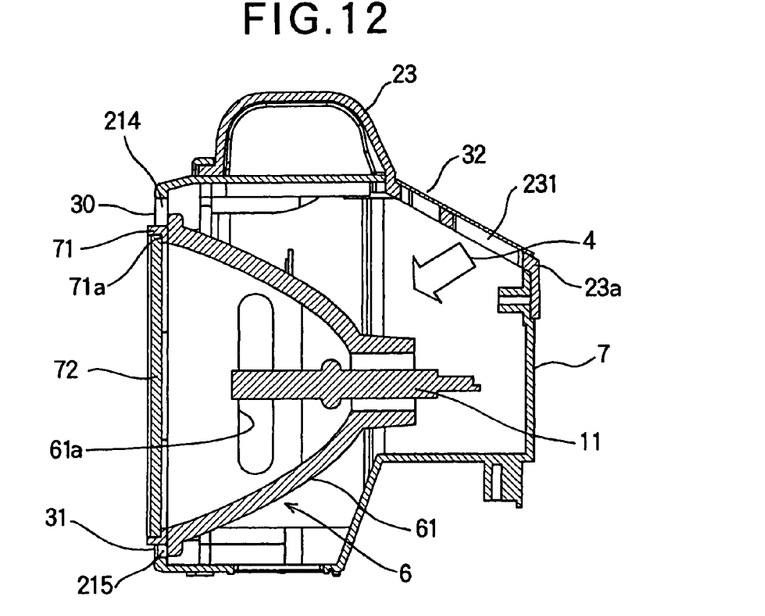
FIG. 12 is a vertical sectional view of a light source device in which the lamp unit shown in FIG. 9 is mounted on the lamp cartridge.
Figure 13:
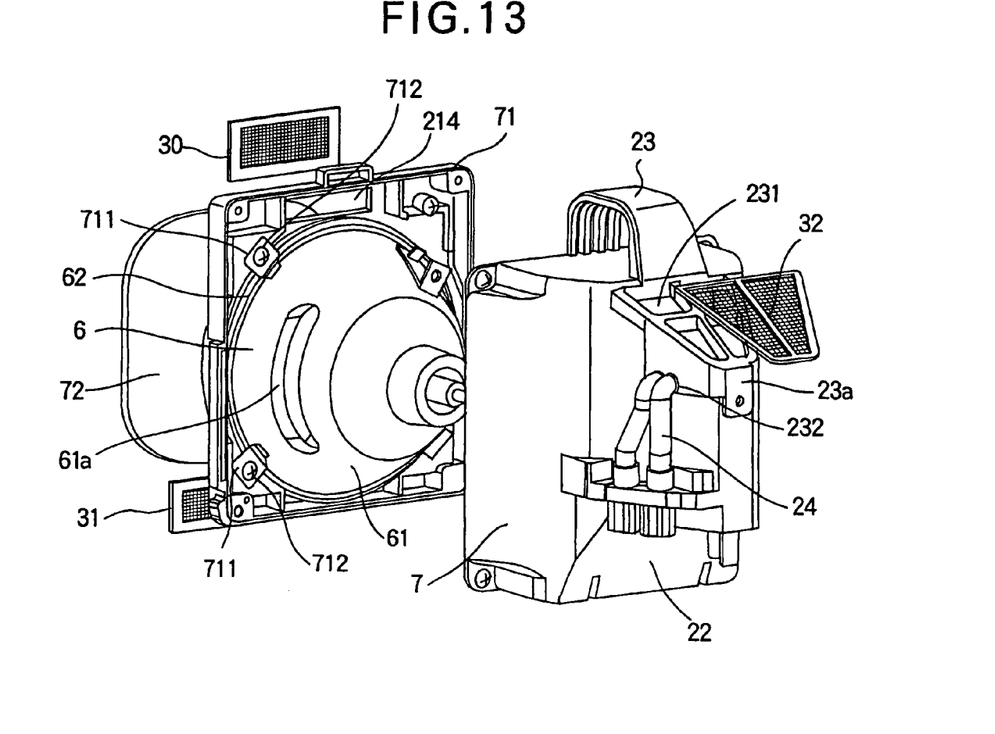
FIG. 13 is an exploded perspective view of the light source device shown in FIG. 12.

FIGS. 12 and 13 are a sectional view and an exploded perspective view (as seen from the rear) showing a lamp cartridge 7 on which the lamp unit 6 shown in FIG. 9 is mounted.

The lamp cartridge 7 shown in FIGS. 12 and 13 is the same as the lamp cartridge 7 shown in FIGS. 10 and 11. The lamp unit 6 is fixed to the front panel 71 of the lamp cartridge 7. As shown in FIG. 13, the brim 62 of the front end of the reflection mirror 61 of the lamp unit 6 is fixed to the front panel 71 of the lamp cartridge 7 by means of four fixing plates 711 and four screws 712. If there is a variation in the thickness of the brim 62 of the reflection mirror 61, it is also possible to use spring members as the fixing plates 711. The transparent plate 72 is provided on the opening of the front panel 71 as was described with reference to FIGS. 10 and 11.

In the light source device shown in FIGS. 10 and 11, the air blown by the air blow fan is introduced into the interior of the lamp cartridge 7 via the ventilation opening 231. The air flows frontward along the rear end portion of the discharge lamp 11 and the back surface of the reflection mirror 51. Further, the air is introduced into the interior of the reflection mirror 51 through the ventilation openings 51a formed on the front end of the reflection mirror 51. After the air absorbs the heat generated by the discharge lamp 11, the air is fed out of the reflection mirror 51 via the ventilation openings 51a, and fed out of the lamp cartridge 7 via the ventilation openings 214 and 215.

Similarly, in the light source device shown in FIGS. 12 and 13, the air blown by the air blow fan is introduced into the interior of the lamp cartridge 7 via the ventilation opening 231. The air flows frontward along the rear end portion of the discharge lamp 11 and the back surface of the reflection mirror 61. Further, the air is introduced into the interior of the reflection mirror 61 through the ventilation openings 61a formed on the center portion of the reflection mirror 61. After the air absorbs the heat generated by the discharge lamp 11, the air is fed out of the reflection mirror 61 via the ventilation openings 61a, and fed out of the lamp cartridge 7 via the ventilation openings 214 and 215.

As in Embodiment 1, the fragment-passage prevention members 30, 31 and 32 are provided on the ventilation openings 214, 215 and 231. The fragment-passage prevention members 30, 31 and 32 prevent the passage of the fragments of the discharge lamp 11, and therefore it is possible to prevent the fragments from being scattered out of the lamp cartridge 7, even when the breakage of the discharge lamp 11 occurs.

As described above, in Embodiment 2, in addition to the advantages of Embodiment 1, the lamp units 5 and 6 whose reflection mirrors have different shapes are mountable on the common lamp cartridge 7, and therefore the productivity of the lamp cartridge 7 can be enhanced, and the manufacturing cost can be reduced.

In the above description, two ventilation openings 214 and 215 are formed on the lamp cartridge 7 as outlet openings. It is possible to omit one of the ventilation openings 214 and 215 as long as the discharge lamp 11 can be sufficiently cooled.

Figure 14:
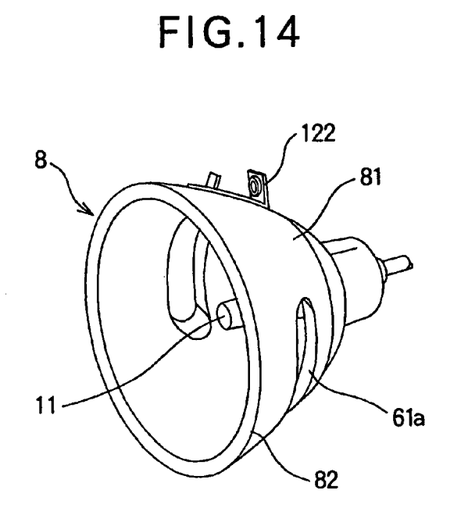
FIG. 14 is a vertical sectional view of a lamp unit according to a modification of Embodiment 2 of the present invention.
Figure 15:
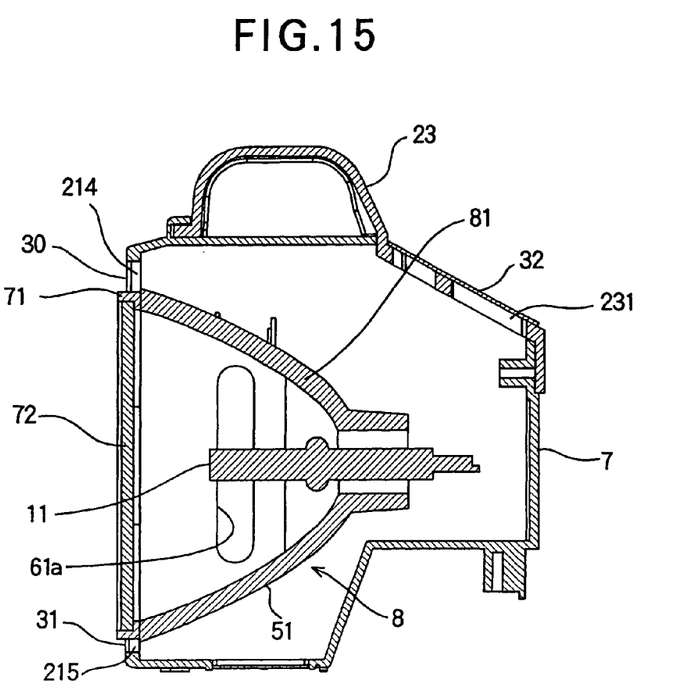
FIG. 15 is a vertical sectional view of a light source device in which the lamp unit shown in FIG. 14 is mounted on the lamp cartridge.
Figure 16:
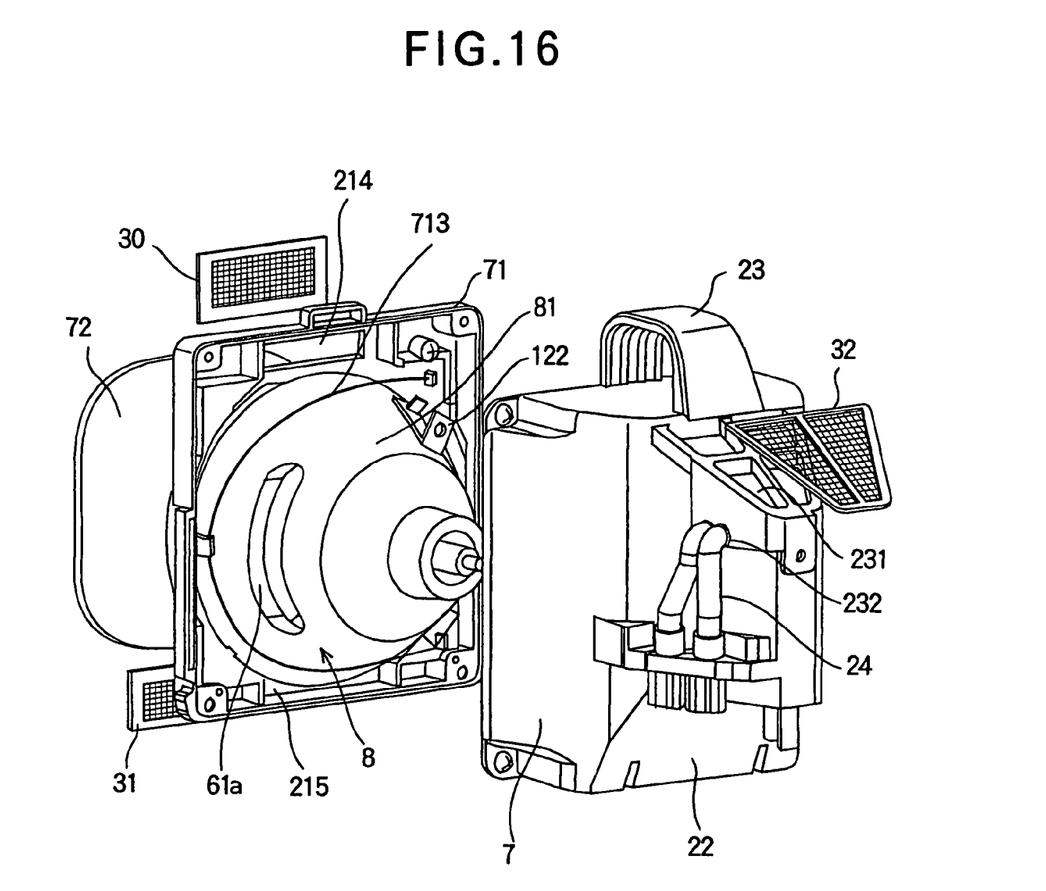
FIG. 16 is an exploded perspective view of the light source device shown in FIG. 15.

FIG. 14 is a perspective view of a lamp unit according to a modification of Embodiment 2 of the present invention. FIG. 15 is a vertical sectional view of the light source device on which the lamp unit shown in FIG. 14 is mounted. FIG. 16 is an exploded perspective view showing the light source device shown in FIG. 15, as seen from the rear. In FIGS. 14 through 16, the components in common with those shown in FIGS. 8 through 13 are assigned the same reference numerals.

In the above described lamp units 5 and 6 (FIGS. 10 through 13), the brims 52 and 62 are provided on the front end of the reflection mirrors 51 and 61. However, it is also possible to mount a lamp unit 8 whose reflection mirror 81 has no brim on a lamp cartridge 7, as shown in FIGS. 14 and 15.

In this case, a wire 71 (for example, a spring wire rod) is wound around the reflection surface 81, and the both ends of the wire 71 are fixed to the front panel 71. With such an arrangement, the lamp unit 8 can be fixed to the front panel 71 of the lamp cartridge 7.

Figure 17:
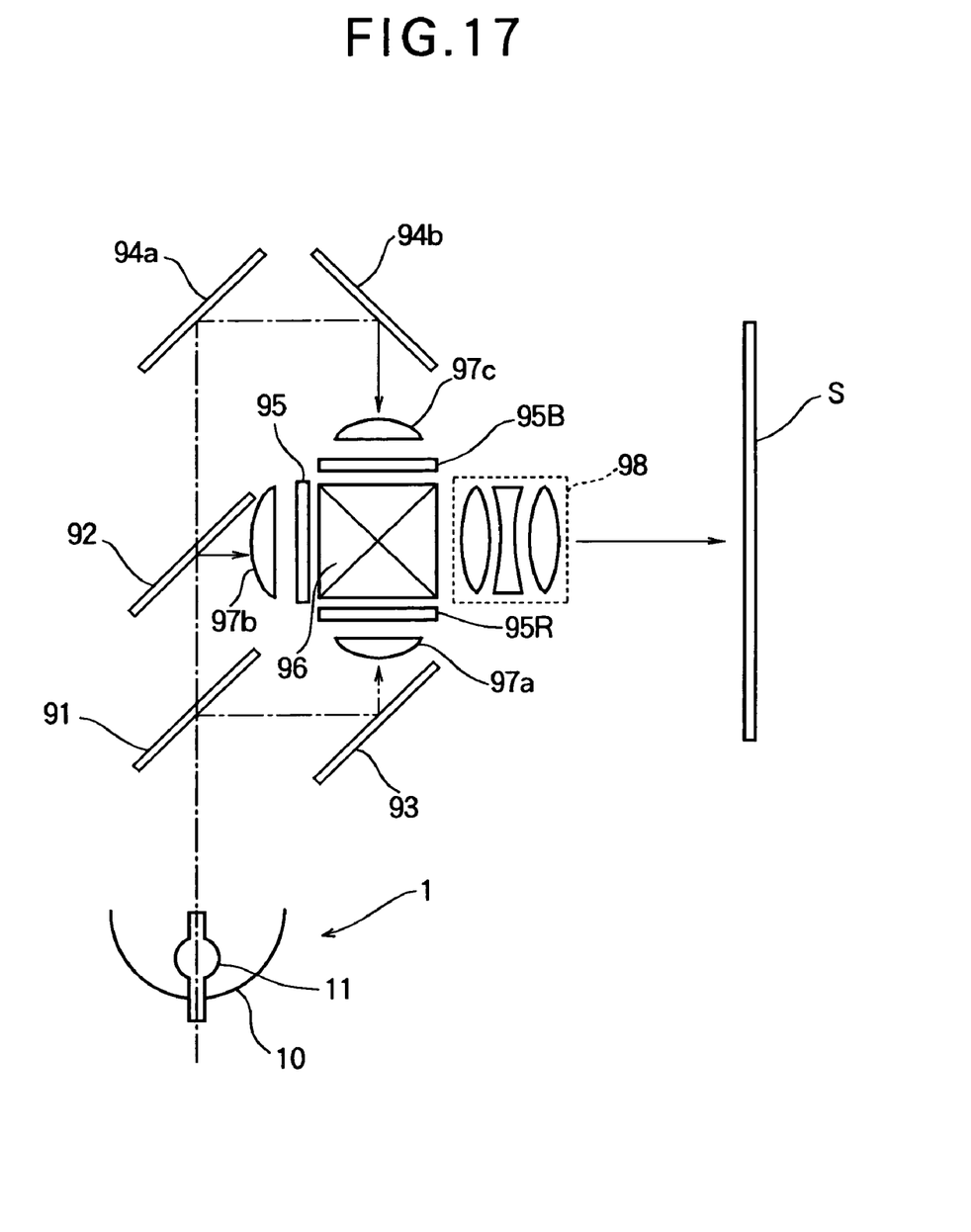
FIG. 17 shows an example of a projection-type image display device in which the light source device according to Embodiments 1 and 2 of the present invention can be used.

Next, a projection-type image display device in which the light source device according to Embodiments 1 and 2 can be mounted will be described. FIG. 17 shows an example of the reflection-type image display device in which the above described light source device 10 is mounted. It goes without saying that the light source device 10 can be mounted in devices other than the reflection-type image display device shown in FIG. 17 as an example.

The reflection-type image display device shown in FIG. 17 includes the above described light source device 10, and dichroic mirrors 91 and 92 that separate the incident white light (emitted by the light source device 10) into lights of red (R), green (G) and blue (B). The reflection-type image display device further include three LCD (liquid crystal display) light bulbs 95R, 95G and 95B that modulate the lights of the respective colors, a prism unit 96 that synthesize the modulated lights of the respective colors, and a projection optical system 98 that projects the synthesized light onto the screen S in an enlarged scale. Further, the reflection-type image display device includes a mirror 93 that introduces the red light (reflected by the dichroic mirror 91) to the LED light bulb 95R, and mirrors 94a and 94b that introduce the blue light (that has passed through the dichroic mirror 91) to the LED light bulb 95B. Condenser lenses 97a, 97b and 97c are disposed on the incident sides of the LCD light bulb 95R, 95G and 95B, which parallelize the incident lights to be incident on the respective light bulbs 95R, 95G and 95B.

The light emitted by the light source device 10 is incident on the dichroic mirror 91. The red light is reflected by the dichroic mirror 91, and is incident on the LCD light bulb 95R via the reflection mirror 93 and the condenser lens 97a. The blue and yellow lights having passed though the dichroic mirror 91 is incident on the dichroic mirror 92. The green light is reflected by the dichroic mirror 92, and is incident on the LCD light bulb 95G via the condenser lens 97b. The blue light having passed the dichroic mirror 92 is incident on the LCD light bulb 95B via the mirrors 94a and 94b and the condenser lens 97c. The lights incident on the LCD light bulbs 95R, 95G and 95B are modulated according to the image information of respective colors, and synthesized by the prism unit 96. The synthesized light is projected onto the screen S by the projection optical system 98.

As described above, even when the discharge lamp 11 in the light source device 10 is broken, the fragment-passage prevention members 30, 31 and 32 (FIG. 1) prevent the fragments of the discharge lamp 11 from being scattered out of the lamp cartridge 2. Therefore, it is possible to prevent the fragments from being scattered in the projection-type image display device.

While the preferred embodiments of the present invention have been illustrated in detail, it should be apparent that modifications and improvements may be made to the invention without departing from the spirit and scope of the invention as described in following claims.

What is claimed is:

1. A light source device comprising:
   a lamp unit comprising a lamp and a reflection mirror that reflects a light from said lamp and emits said light, said reflection mirror having at least one ventilation opening;
   a lamp cartridge that houses said lamp unit, said lamp cartridge having at least one ventilation opening, one of said lamp cartridge and said lamp unit having a transparent plate disposed on a light emitting side of said reflection mirror,
   wherein said lamp cartridge has at least one ventilation opening which is an outlet ventilation opening formed on a front wall of said lamp cartridge, said front wall being disposed on the light emitting side of said reflection mirror, said outlet ventilation opening directly opening to the outside of said light source device, and another ventilation opening which is an inlet ventilation opening on a rear side of said lamp cartridge with respect to said reflection mirror, so that air flows from said inlet ventilation opening on said rear side, toward said front wall along a back surface of said reflection mirror, and out of said outlet ventilation opening, and where a fragment-passage prevention member is provided on at least one of said ventilation openings of said lamp cartridge, and said fragment-passage prevention member allows the passage of the air, but prevents the passage of fragments of said lamp.

2. The light source device according to claim 1, wherein said transparent plate is provided on said lamp unit.

3. The light source device according to claim 2, wherein said ventilation opening of said reflection mirror of said lamp unit is formed on an end of a light emitting side of said reflection mirror.

4. The light source device according to claim 2, wherein said lamp cartridge has a shielding member where said lamp cartridge contacts a peripheral end of said transparent plate.

5. The light source device according to claim 1, wherein said transparent plate is provided on said lamp cartridge.

6. The light source device according to claim 5, wherein a first type of said lamp unit is mountable on said lamp cartridge, and wherein said reflection mirror of said first type of said lamp cartridge has said ventilation opening at an end of a light emitting side thereof.

7. The light source device according to claim 5, wherein said reflection mirror of a second type of said lamp unit has said ventilation opening at a center portion thereof.

8. The light source device according to claim 5, wherein said lamp unit is fixed to said lamp cartridge by means of wire wound around said reflection mirror.

9. The light source device according to claim 1, wherein said fragment-passage prevention member includes a mesh member having a mesh size that does not allow the passage of said fragments.

10. The light source device according to claim 1, wherein said lamp cartridge has at least one ventilation opening on a light emitting side of said lamp unit, and at least one ventilation opening on the opposite side of said lamp unit.

11. A projection-type image display apparatus comprising: said light source device according to claim 1, and
a projection system that modulates said light emitted by said light source device and projects said light onto a screen.

* * * * *